(12) United States Patent
Chen et al.

(10) Patent No.: US 7,752,746 B2
(45) Date of Patent: Jul. 13, 2010

(54) METHOD OF PARTIALLY ATTACHING AN ADDITIONAL ATTACHING MATERIAL FOR VARIOUS TYPES OF PRINTED CIRCUIT BOARDS

(75) Inventors: Yu-Jen Chen, Taipei County (TW); Kai-Hsiang Chiang, Taipei County (TW)

(73) Assignee: Unitech Printed Circuit Board Corp., Taipei (TW)

( * ) Notice: Subject to any disclaimer, the term of this patent is extended or adjusted under 35 U.S.C. 154(b) by 325 days.

(21) Appl. No.: 11/892,838

(22) Filed: Aug. 28, 2007

(65) Prior Publication Data

US 2009/0056117 A1 Mar. 5, 2009

(51) Int. Cl.
*H05K 3/36* (2006.01)

(52) U.S. Cl. .............................. 29/830; 29/827; 29/829; 29/832; 29/833; 29/834

(58) Field of Classification Search .................. 29/827, 29/829, 830, 832–836; 427/96.2; *H05K 3/00*
See application file for complete search history.

(56) References Cited

U.S. PATENT DOCUMENTS 4,859,189 A * 8/1989 Petersen et al. ............... 439/66

2007/0215992 A1 * 9/2007 Shen et al. .................. 257/668

FOREIGN PATENT DOCUMENTS

JP     2002290033 A  * 10/2002
JP     2007049179 A  *  2/2007

* cited by examiner

*Primary Examiner*—Derris H Banks
*Assistant Examiner*—Azm Parvez
(74) *Attorney, Agent, or Firm*—Muncy, Geissler, Olds & Lowe, PLLC

(57) ABSTRACT

In a method of partially attaching an additional attaching material for various types of printed circuit boards, the method attaches an additional attaching material partially onto circuit blocks after circuits of the circuit blocks are made on a flexible, rigid or mixed printed circuit board or an insulating layer is coated. The method sets an attaching material on a shaping material that covers the circuit blocks, uses a depth control tool to cut away areas not corresponding to those requiring to be attached onto the necessary circuit blocks, aligns the corresponding positions of the circuit blocks to perform pseudo attachment and pressing, and tears away the shaping material from the attaching material, so as to attach additional attaching materials properly onto the predetermined positions of the circuit blocks without requiring to attach the circuit blocks one by one, and achieve the effect of saving manufacturing time and avoiding misalignment.

6 Claims, 6 Drawing Sheets

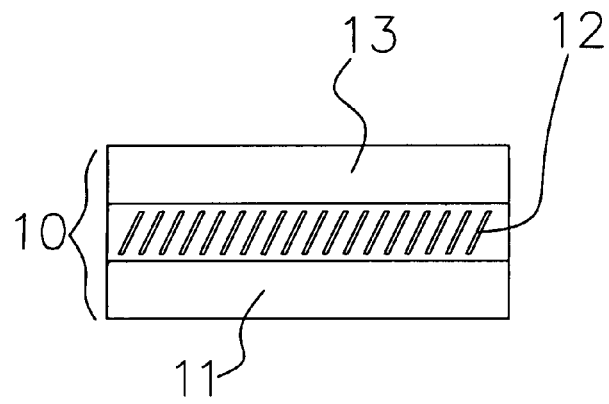
FIG. 1a
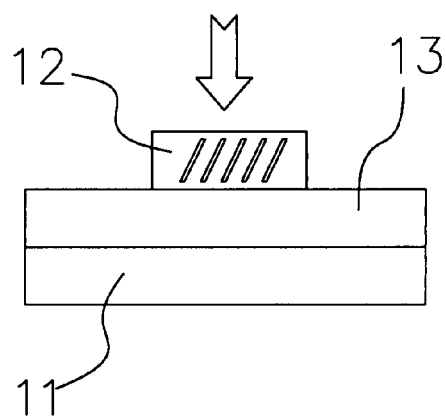
FIG. 1d
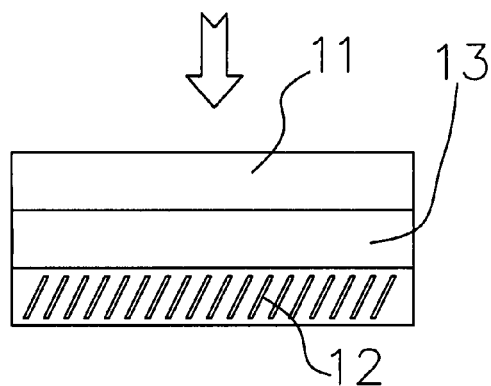
FIG. 1b
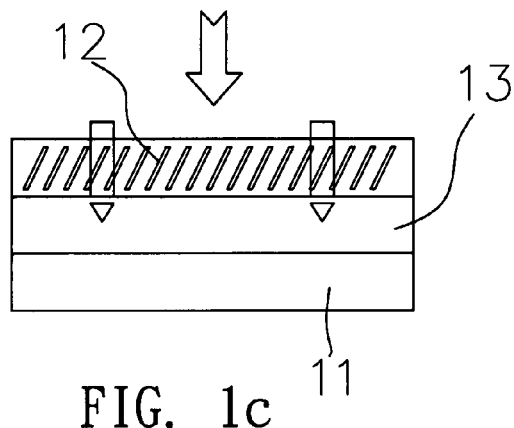
FIG. 1c
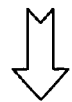

METHOD OF PARTIALLY ATTACHING AN ADDITIONAL ATTACHING MATERIAL FOR VARIOUS TYPES OF PRINTED CIRCUIT BOARDS

BACKGROUND OF THE INVENTION

1. Field of the Invention

The present invention relates to a method of partially attaching an additional attaching material for various types of printed circuit boards, and more particularly to a method of attaching an electromagnetic interference (EMI) metal plate or a protection film after printing circuits on a circuit block of the printed circuit board or coating an insulating layer, so as to save manufacturing time and avoid misalignment.

2. Description of the Related Art

Rigid printed circuit board is also known as rigid board, which is a basic carrier for electronic products in the industries of information, electronics, communications, consumer electronics, aerospace, and national defense, etc. These products are developed and manufactured in a trend of small diameter, high density, multilayer and small circuit.

On the other hand, flexible printed circuit board is also know as flexible printed circuit (FPC) which has the light, thin, small, bendable, low-voltage and low consuming power properties. Since the shape of these products can be changed according to the required spatial design and these products are bendable and EMI-resisting, therefore their size and weight can be reduced greatly, and the flexible printed circuit boards have replaced traditional rigid boards progressively and are used extensively in many different commercial areas such as satellites and medical treatments, etc. In the recent decade, information and consumer electronic products are developed rapidly, and both consumption and quality of the flexible boards grow rapidly under the user requirements for small volume and light weight. At present, local manufacturers primarily manufacture single-sided and double-sided panels for notebook computers, mobile phones, liquid crystal displays, optical disk drive, and digital cameras, etc.

To meet the requirements of the area and the circuit density for various different light, thin, short and compact products (such as mobile phones and liquid crystal displays), manufacturers generally combine and mix flexible and rigid printed circuit boards for their applications.

Regardless of a rigid, flexible or mixed mode of the printed circuit board, a plurality of circuit blocks are arranged on a printed circuit board, depending on the size of the circuit block of the printed circuit board or manufacturing requirements. After a circuit layer is produced onto a circuit by lithography, it is necessary to coat a layer of protection film or cover an electromagnetic interference (EMI) metal plate onto the circuit block to achieve the effects of preventing copper wires from being oxidized, protecting the circuit block from being affected by humidity, and enhancing the durability of the circuit. However, these protection films are very soft or small, and thus it is very difficult to cover the circuit block flatly and uniformly by the protection films. Skillful operators are required for aligning and covering the blocks one by one, and thus the conventional manufacturing method cannot be used for automation and mass production, and the manufacturing remains very high.

SUMMARY OF THE INVENTION

In view of the foregoing shortcomings of the prior art, the inventor of the present invention conducted extensive researches and developed a method of partially attaching an additional attaching material for various types of printed circuit boards in accordance with the present invention to overcome the shortcomings of the prior art.

Therefore, it is a primary objective of the present invention to provide a method of partially attaching an additional attaching material for various types of printed circuit boards, wherein a plurality of circuit blocks are disposed on a printed circuit board, and a cover film is coated onto an area covering a plurality of circuit blocks, while attaching the attaching material onto the desired areas of the plurality of circuit blocks at a time.

Another objective of the present invention is to set an attaching material onto a shaping material, and cut the attaching material that is not at the corresponding attaching area by a depth control tool, and then align a plurality of circuit blocks to their corresponding positions all at the same time, and tear away the shaping material from the attaching material, so that the attaching material can be attached onto the predetermined positions of the plurality of circuit blocks all at the same time without attaching the attaching material onto the circuit blocks one by one, so as to save time and avoid misalignment.

BRIEF DESCRIPTION OF THE DRAWINGS

FIGS. 1A to 1D are schematic views showing a flow of manufacturing an electromagnetic interference (EMI) metal plate in accordance with a preferred embodiment of the present invention;

DETAILED DESCRIPTION OF THE PREFERRED EMBODIMENTS

To make it easier for our examiner to understand the method and structure of the invention, we use a preferred embodiment together with the attached drawings for the detailed description of the invention.

Figure 2A:
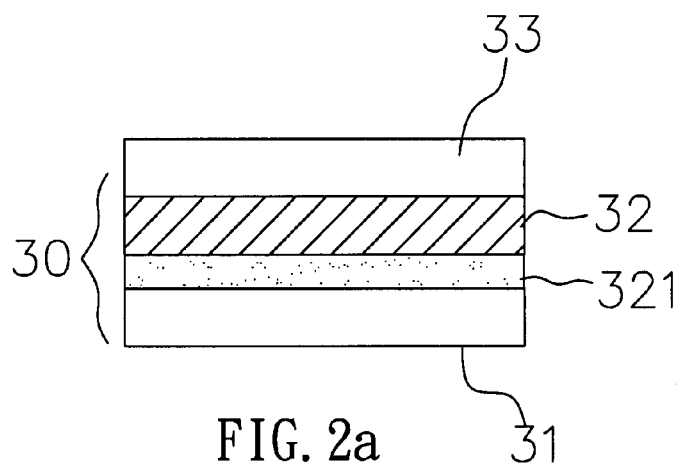
FIGS. 2A to 2D are schematic views showing a flow of manufacturing a protection film in accordance with a preferred embodiment of the present invention.
Figure 3:
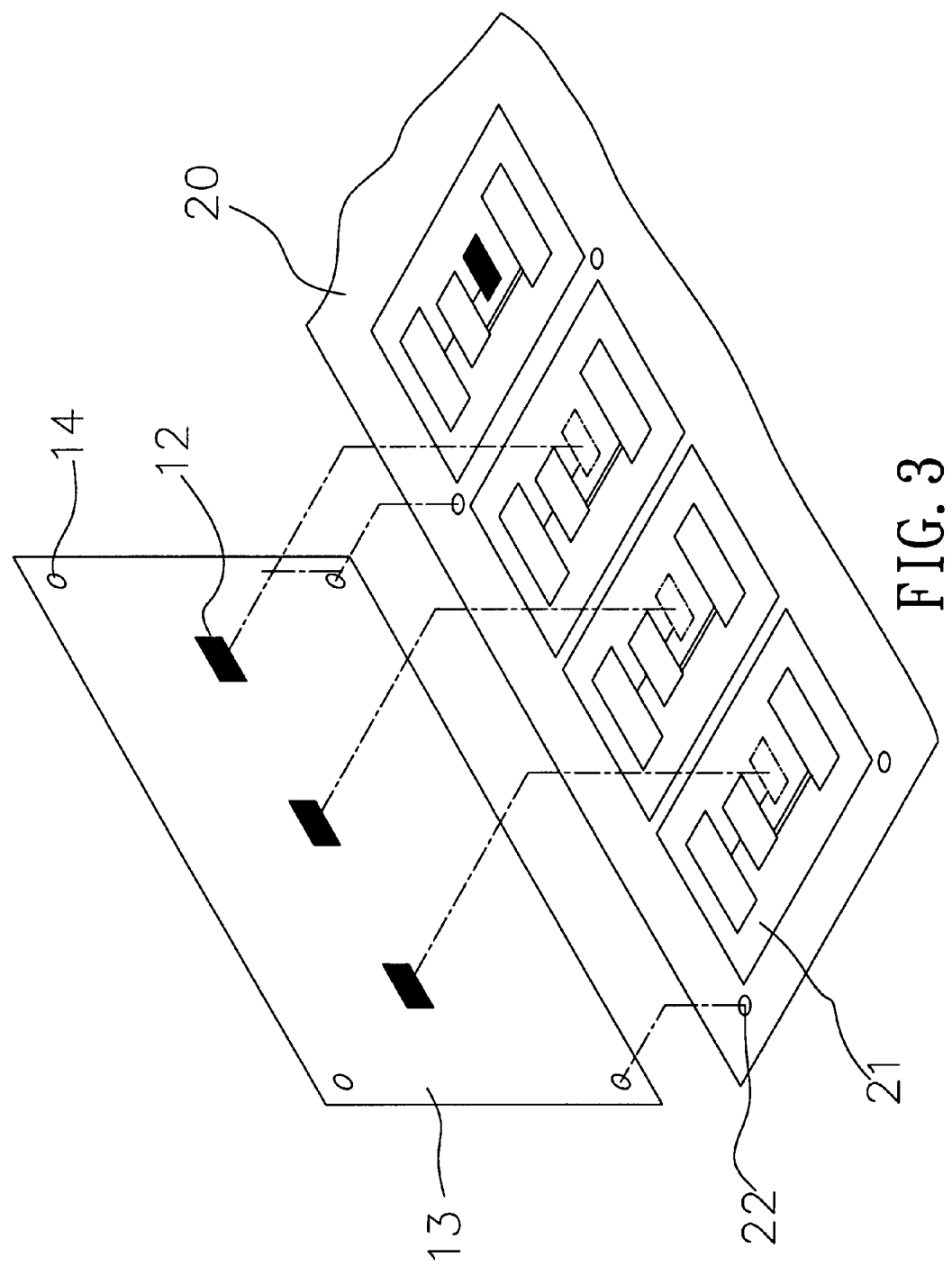
FIGS. 3 and 4 are schematic views of attaching an electromagnetic interference (EMI) metal plate or a protection film onto a circuit board in accordance with the present invention.

Referring to FIG. 3, the present invention provides a method of partially attaching an additional attaching material for various types of printed circuit boards, wherein a plurality of circuit blocks 21, which are completed with circuits or coated with an insulating layer, are disposed on a printed circuit board 20, and an attaching material is applied onto specific areas of the circuit blocks 21, and the attaching material can be an electromagnetic interference (EMI) metal plate or a protection film. The electromagnetic interference (EMI) shielding film 10 is composed of a release paper 11, an electromagnetic interference (EMI) metal plate 12 and a shaping material 13 (as shown in FIG. 1A), and the protection film module 30 is composed of a release paper 31, a protection film 32 and a shaping material 33, and the protection film 32 is coated with an epoxy resin glue 321 (as shown in FIG. 2A). Referring to FIGS. 1A~1D for a manufacturing method of an electromagnetic interference (EMI) metal plate in accordance with a preferred embodiment of the present invention, the manufacturing method comprises the steps of:

Tearing open the release paper 11 on the electromagnetic interference (EMI) shielding film 10 that covers the areas of a plurality of circuit blocks 21 of the printed circuit board 20 to expose the electromagnetic interference (EMI) metal plate 12 (as shown in FIG. 1A); attaching the release paper 11 onto the shaping material 13 which is Mylar in this embodiment (as shown in FIG. 1B); cutting a metal plate area on the electromagnetic interference (EMI) metal plate 12 and not in corresponding positions attached with the circuit blocks 21 by a depth control tool (as shown in FIG. 1C); removing unnecessary electromagnetic interference (EMI) metal plates 12 from the shaping material 13 (as shown in FIG. 1D), so as to complete a plurality of shielding films 10 having the electromagnetic interference (EMI) effect and attached with the attaching material.

Figure 2D:
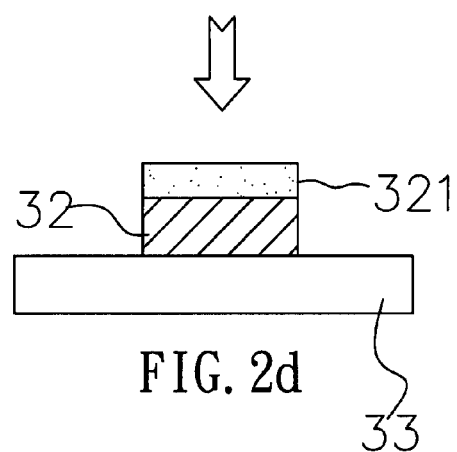
Figure 2B:
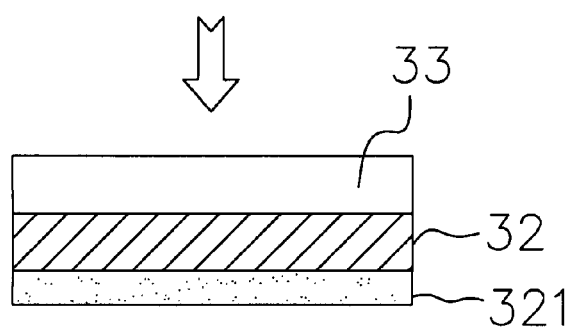
Figure 2C:
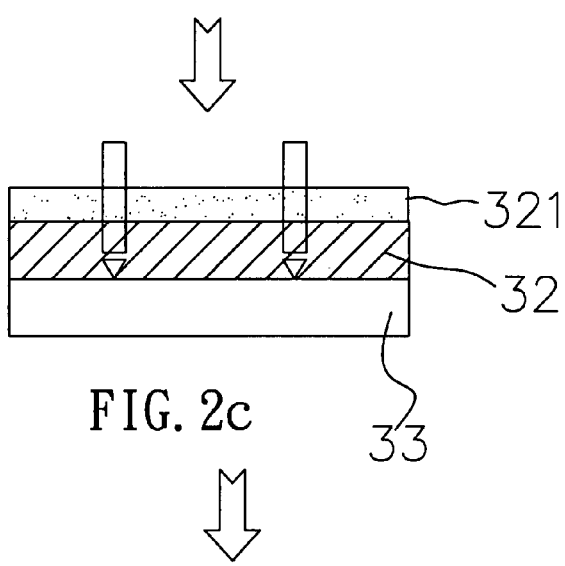

Referring to FIGS. 2A~2D for the flow of a manufacturing method of coating a protection film onto a circuit block in accordance with the present invention, the manufacturing method comprises the steps of:

Tearing away the release paper 31 of the protection film module 30 on the areas covering the plurality of circuit blocks 21 of the printed circuit board 20 (as shown in 2A and 2B) to expose the epoxy resin glue 321 coated on the protection film 32 which is made of polymide (PI) in this embodiment; cutting the areas of the protection films 32 corresponding to the area that is not intended to be attached with the circuit block 21 by a depth control tool (as shown in FIG. 2C); tearing away unnecessary protection film 32 from the shaping material 33 which is a carrier tape in this embodiment (as shown in FIG. 2D), so as to complete a plurality of attaching materials that are disposed on the shaping material 33 and intended to be attached onto the circuit blocks 21.

Figure 4:
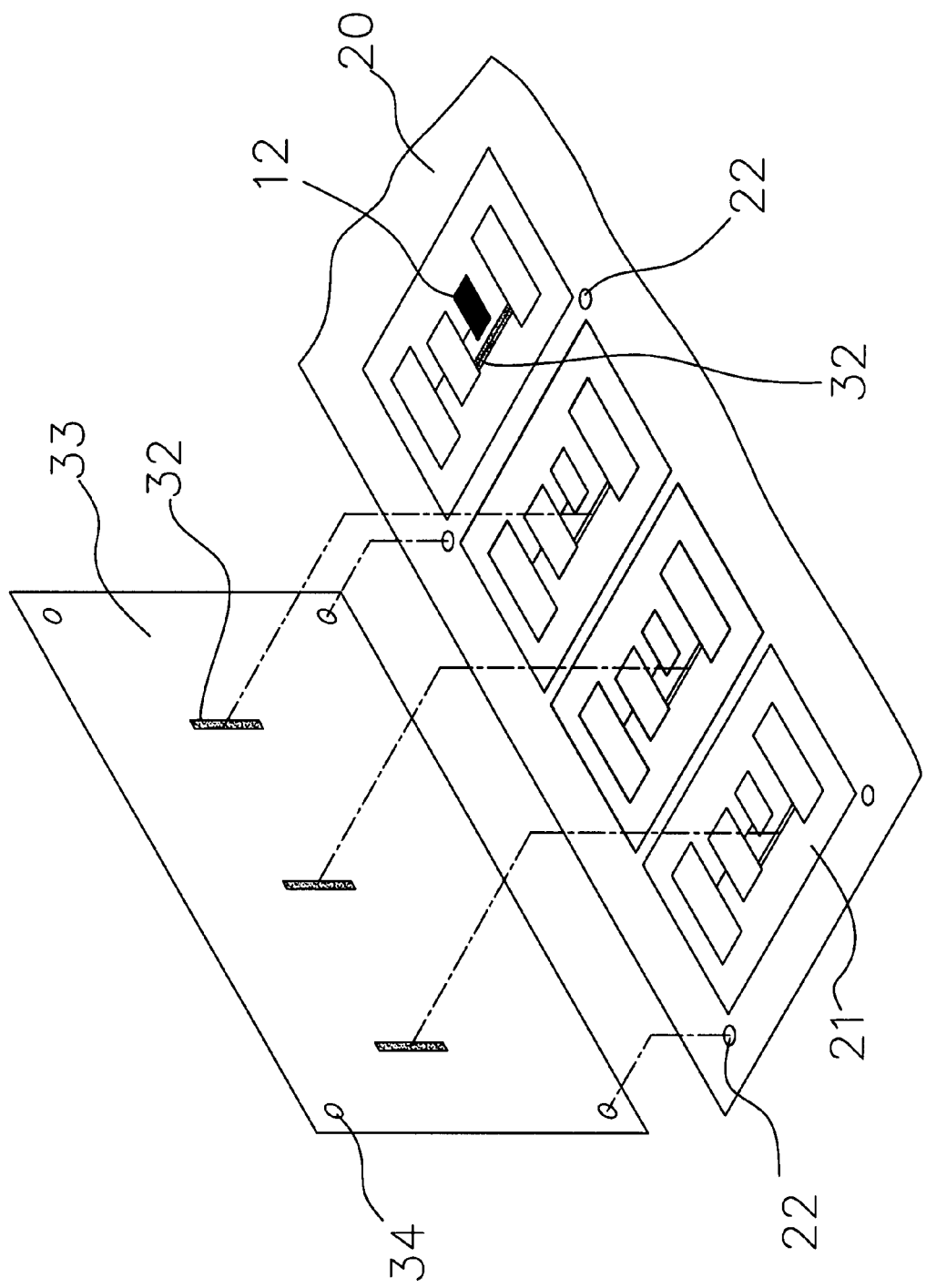
Figure 5:
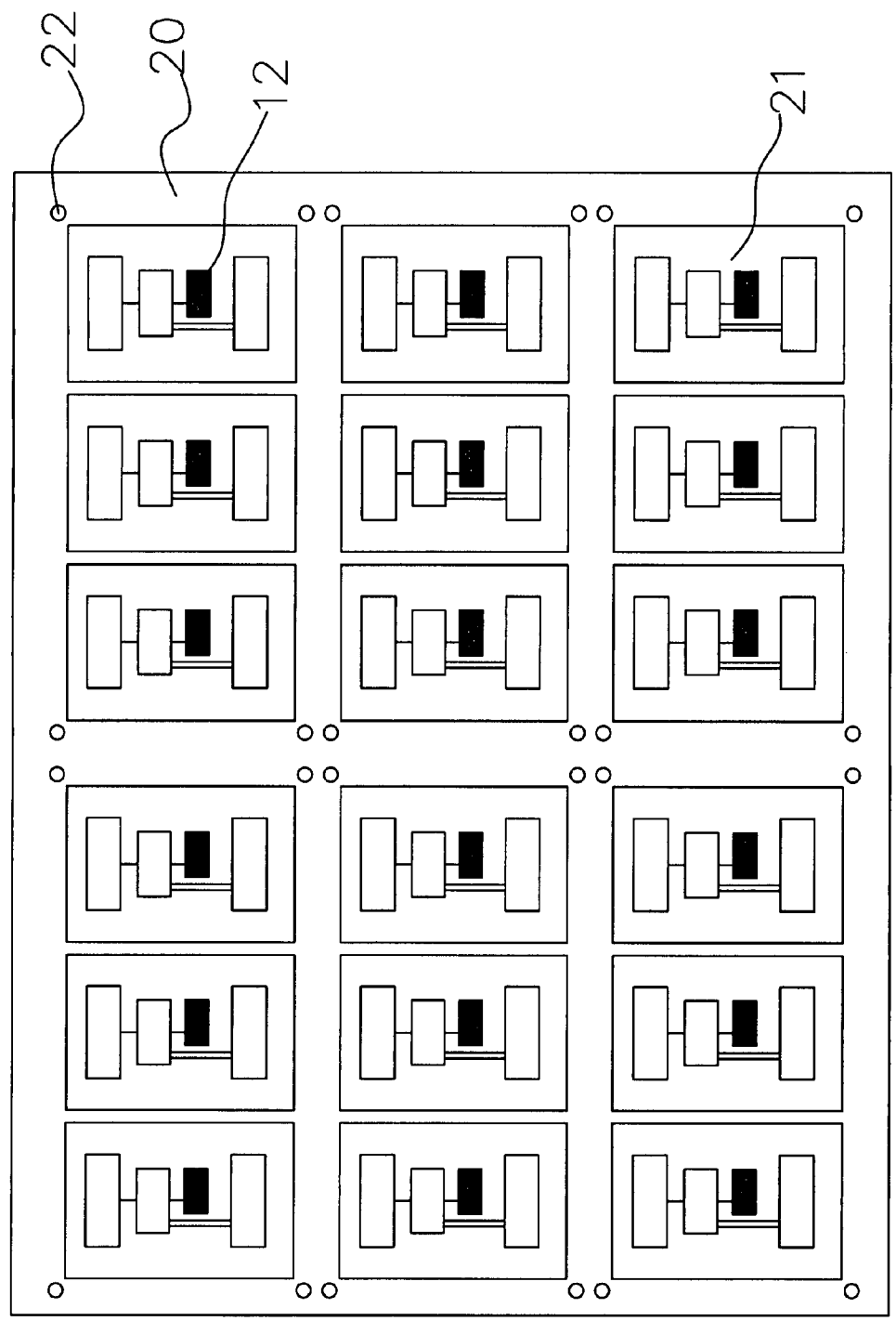
FIG. 5 is a schematic view of an attached circuit board in accordance with the present invention.
Figure 6:
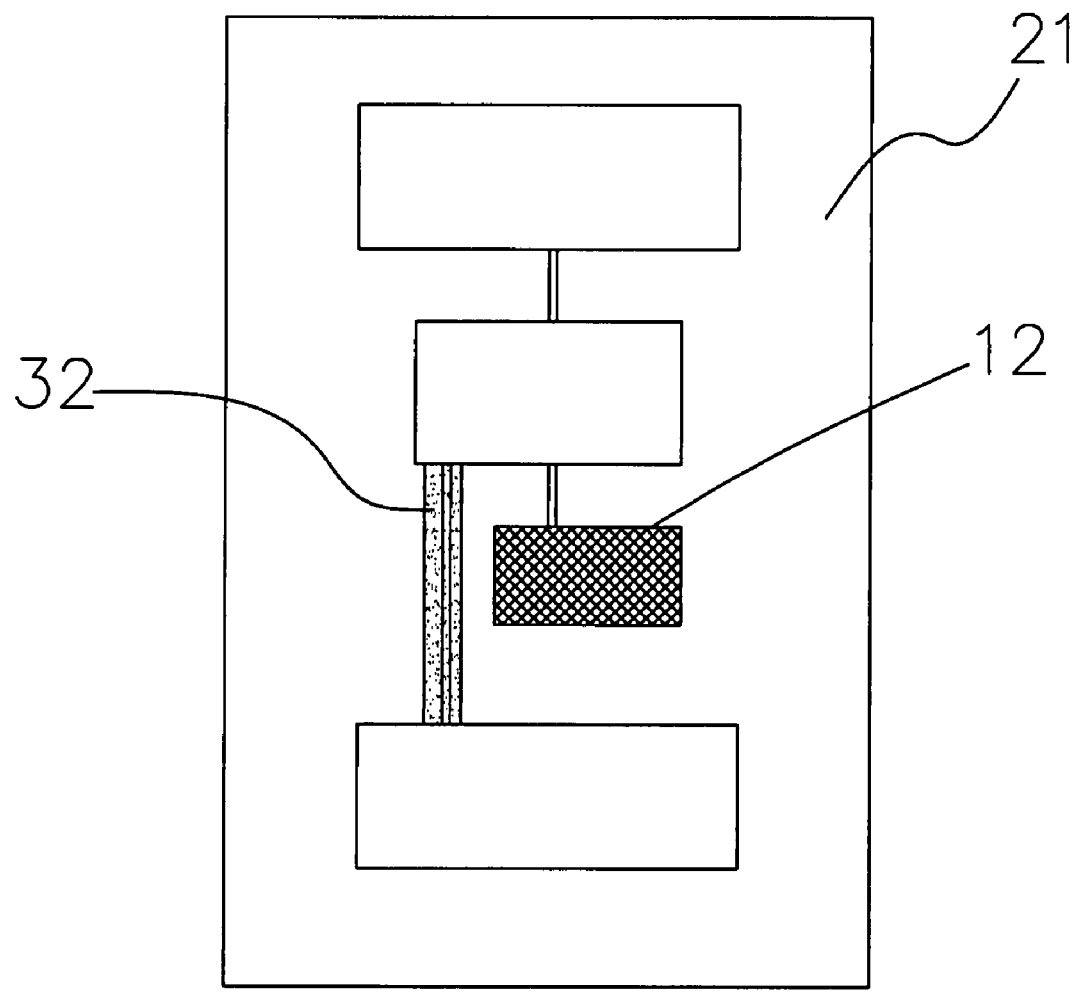
FIG. 6 is a schematic view of a finished good of an attached circuit board in accordance with the present invention.

Referring to FIGS. 3 and 4 for a method of attaching an electromagnetic interference (EMI) metal plate 12 or a protection film 32 onto a circuit block 21 in accordance with the present invention, the method comprises the steps of:

Setting corresponding points 14, 34 at distal edges of shaping material 13, 33 that are deposited on the areas covering the plurality of circuit blocks 21 and including an unnecessary metal plate 12 or protection film 32; setting more than one reference points 22 on a desired printed circuit board 20, such that the reference points 22 correspond to the corresponding points 14, 34 at the distal edges of the shaping material 13, 33 of the electromagnetic interference (EMI) shielding film 10 or the protection film module 30, and the corresponding points 14, 34 are aligned with the reference points 22 of the printed circuit board 20, and the metal plate 12 or protection film 32 on the shaping material 13, 33 can be aligned with the predetermined positions for performing a pseudo attachment and pressing operation; and tearing away the shaping material 13, 33 from the metal plate 12 or the protection film 32, so as to attach the metal plate 12 or the protection film 32 onto a specific position of each circuit block 21 (as shown in FIGS. 5 and 6) without the need of aligning one by one. The invention not only attaches the attaching materials onto the desired areas of the circuit blocks 21 that require electromagnetic interference (EMI) or enhanced protection, but also save the manufacturing cost significantly.

In summation of the description above, the present invention is a method that can avoid attaching the attaching materials onto the printed circuit boards one by one by means of a pre-manufacturing operation, and thus the present invention enhances the performance than the conventional structure and further complies with the patent application requirements and is submitted to the Patent and Trademark Office for review and granting of the commensurate patent rights.

While the invention has been described by means of specific embodiments, numerous modifications and variations could be made thereto by those skilled in the art without departing from the scope and spirit of the invention set forth in the claims.

What is claimed is:

1. A method of partially attaching an additional attaching material for various types of printed circuit boards, and the method being applied to a printed circuit board having a plurality of circuit blocks, and said circuit blocks are printed with circuits or coated with an insulating layer thereon; and said additional attaching material applied onto specific areas of said circuit blocks, and said method comprising the steps of:

applying a shaping material that contains an attaching material onto an area covering at least two circuit blocks of the printed circuit board, and cutting the attaching material that is not on a corresponding specific area of the block circuit by a tool, and setting more than one corresponding points at a distal edge of the shaping material; and setting a reference point at a specific position of printed circuit board and corresponding to each corresponding point, such that when the attaching material is attached, the corresponding point corresponds to the reference point, and attaching the attaching material capable of covering the plurality of circuit blocks at a specific area, and performing a pseudo attachment and pressing, and tearing away the shaping material from the attaching material;

such that the attaching material is attached correctly on predetermined positions of the circuit blocks, and aligning a plurality of circuit blocks all at the same time without attaching the attachment onto the circuit blocks one by one, so as to save time and avoid misalignment.

2. The method of partially attaching an additional attaching material for various types of printed circuit boards as recited in claim 1, wherein the attaching material is an electromagnetic interference (EMI) metal plate.

3. The method of partially attaching an additional attaching material for various types of printed circuit boards as recited in claim 1, wherein the attaching material is a protection film.

4. The method of partially attaching an additional attaching material for various types of printed circuit boards as recited in claim 3, wherein the protection film is made of polymide and epoxy resin glue.

5. The method of partially attaching an additional attaching material for various types of printed circuit boards as recited in claim 1, wherein the shaping material is Mylar.

6. The method of partially attaching an additional attaching material for various types of printed circuit boards as recited in claim 1, wherein the shaping material is a carrier tape.

\* \* \* \* \*